(12) United States Patent  
Larson

(10) Patent No.: US 9,818,742 B2
(45) Date of Patent: Nov. 14, 2017

(54) SEMICONDUCTOR DEVICE ISOLATION USING AN ALIGNED DIFFUSION AND POLYSILICON FIELD PLATE

(75) Inventor: William Larson, Minnetonka, MN (US)

(73) Assignee: POLAR SEMICONDUCTOR, LLC, Bloomington, MN (US)

(*) Notice: Subject to any disclaimer, the term of this patent is extended or adjusted under 35 U.S.C. 154(b) by 814 days.

(21) Appl. No.: 13/469,917

(22) Filed: May 11, 2012

(65) Prior Publication Data

US 2013/0299911 A1 Nov. 14, 2013

(51) Int. Cl.
*H01L 27/088* (2006.01)
*H01L 21/761* (2006.01)
*H01L 21/8234* (2006.01)
*H01L 21/765* (2006.01)

(52) U.S. Cl.
CPC .......... *H01L 27/088* (2013.01); *H01L 21/765* (2013.01); *H01L 21/823481* (2013.01)

(58) Field of Classification Search
CPC ............................ H01L 27/088; H01L 21/761
USPC ............................................. 257/368, E27.06
See application file for complete search history.

(56) References Cited

U.S. PATENT DOCUMENTS

| 4,290,078 | A | * | 9/1981 | Ronen | 257/409 |
| 4,305,085 | A | | 12/1981 | Jaecklin et al. | |
| 5,286,990 | A | * | 2/1994 | Hynecek | 257/247 |
| 5,441,902 | A | | 8/1995 | Hsieh et al. | |
| 5,686,754 | A | | 11/1997 | Choi et al. | |
| 2006/0071294 | A1 | * | 4/2006 | Lowis | 257/510 |
| 2006/0220099 | A1 | * | 10/2006 | Kikuchi et al. | 257/315 |
| 2009/0230430 | A1 | * | 9/2009 | Miyamoto et al. | 257/192 |
| 2010/0140729 | A1 | * | 6/2010 | Banghart et al. | 257/431 |
| 2010/0264507 | A1 | * | 10/2010 | Takahashi et al. | 257/491 |
| 2011/0024803 | A1 | * | 2/2011 | Larson et al. | 257/288 |

* cited by examiner

*Primary Examiner* — Olik Chaudhuri
*Assistant Examiner* — Lamont Koo
(74) *Attorney, Agent, or Firm* — Kinney & Lange, P.A.

(57) ABSTRACT

An isolation structure prevents inter-device and intra-device leakage in first and second adjacent semiconductor devices in a substrate. The first and second semiconductor devices each include a gate region and at least one active region. A first channel stop region is configured to surround the first semiconductor device. A second channel stop region is configured to surround the second semiconductor device. A first field plate is located above at least part of the first channel stop region, and overlaps the gate region of the first semiconductor device in a first overlap region. A second field plate is located above at least part of the second channel stop region, and overlaps the gate region of the second semiconductor device in a second overlap region.

14 Claims, 2 Drawing Sheets

SEMICONDUCTOR DEVICE ISOLATION USING AN ALIGNED DIFFUSION AND POLYSILICON FIELD PLATE

BACKGROUND

The present invention relates to isolation of a semiconductor device, and more particularly to an implanted channel stop layer aligned to a polysilicon field plate layer to achieve isolation in a semiconductor device.

Metal routing and ionic contamination from packaging can induce unwanted leakage in metal oxide semiconductor (MOS) circuits. This leakage can manifest itself as current flow between adjacent devices in a circuit, or as current flow internal to a single device. In high voltage analog circuits, high resistivity silicon layers are used to support the high operating voltage. High resistivity silicon is sensitive to induced leakage current from metal routing and ionic contamination. An isolation method and scheme is employed that reduces current leakage without unduly limiting the maximum operating voltage.

SUMMARY

The present invention, in an exemplary embodiment, is an isolation structure for preventing inter-device and intra-device leakage in first and second adjacent semiconductor devices in a substrate. The first and second semiconductor devices each include a gate region and at least one active region. A first channel stop region is configured to surround the first semiconductor device. A second channel stop region is configured to surround the second semiconductor device. A first field plate is located above at least part of the first channel stop region, and overlaps the gate region of the first semiconductor device in a first overlap region. A second field plate is located above at least part of the second channel stop region, and overlaps the gate region of the second semiconductor device in a second overlap region.

DETAILED DESCRIPTION

Figure 1:
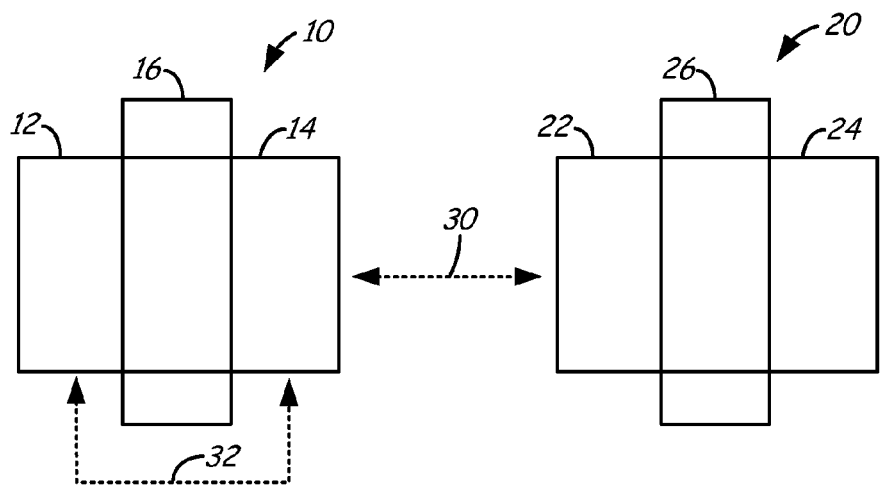
FIG. 1 is a diagram showing two adjacent semiconductor devices to illustrate inter-device and intra-device leakage.

FIG. 1 is a diagram showing two adjacent MOS transistors 10 and 20 to illustrate inter-device and intra-device leakage. First MOS transistor 10 includes drain region 12, source region 14 and polysilicon gate region 16, and second MOS transistor 20 includes drain region 22, source region 24 and polysilicon gate region 26. Inter-device leakage between first MOS transistor 10 and second MOS transistor 20 is shown by path 30. Intra-device leakage in first MOS transistor 10 is shown by path 32. Inter-device leakage and intra-device leakage can both be caused by ionic contamination or metal routing above the MOS transistors.

Figure 2:
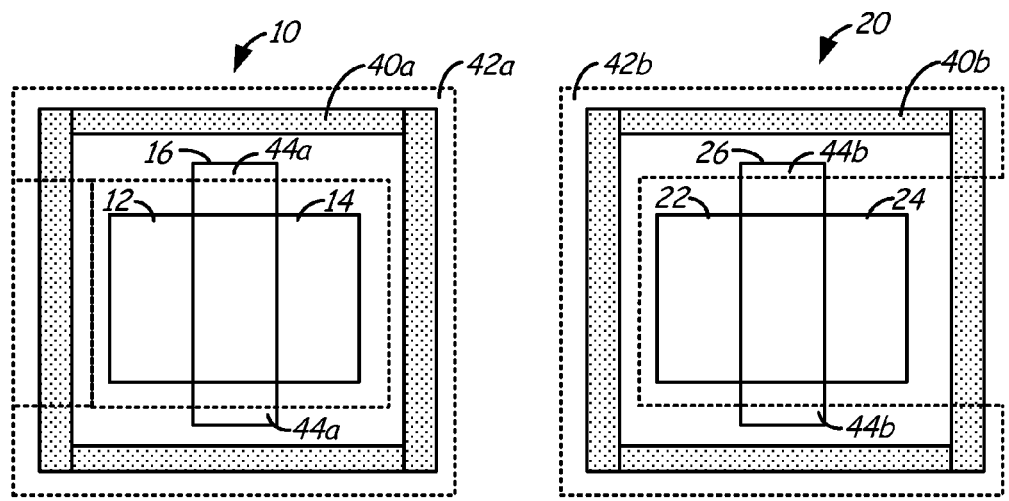
FIG. 2 is a top down view of adjacent semiconductor devices having a channel stop and field plate configuration for preventing inter-device and intra-device leakage according to an embodiment of the present invention.

FIG. 2 is a top down view of adjacent MOS transistors 10 and 20 having a channel stop and field plate configuration for preventing inter-device and intra-device leakage according to an embodiment of the present invention. Surface inversion may occur in and between MOS transistors 10 and 20 due to ionic contamination by or from the plastic packaging of the circuit that includes MOS transistors 10 and 20, or due to high voltages of metal layers located above MOS transistors 10 and 20, for example. Diffused channel stops 40a and 40b are configured to surround MOS transistors 10 and 20, respectively. In an exemplary embodiment, channel stops 40a and 40b are regions where the doping concentration of the MOS device body region is greater than $5\times10^{18}$ $cm^{-3}$. In the case of NMOS devices, the channel stop is P type conductivity; in the case of PMOS devices, the channel stop is N type conductivity. Channel stops 40a and 40b prevent surface inversion of the silicon region between adjacent MOS transistors 10 and 20, which might otherwise occur in leakage path 30 shown in FIG. 1.

Field plates 42a and 42b, made of a second layer of polysilicon, are located above all or part of channel stops 40a and 40b, respectively. Field plates 42a and 42b overlap both ends of polysilicon gate regions 16 and 26, respectively (with field plates 42a and 42b being located over gate regions 16 and 26), shown as overlap regions 44a and 44b. The overlap of field plates 42a and 42b and gate regions 16 and 26 prevents intra-device leakage that might otherwise occur as shown by path 32 in FIG. 1, by controlling the surface potential of the silicon in the spaces separating polysilicon gate regions 16 and 26 and channel stops 40a and 40b, thereby eliminating leakage in path 32 shown in FIG. 1. In an exemplary embodiment, this is achieved by holding field plates 42a and 42b at the same potential as channel stops 40a and 40b, respectively, typically by connection with a metal interconnect. This potential may be ground potential or a supply potential, in various exemplary embodiments.

Figure 3:
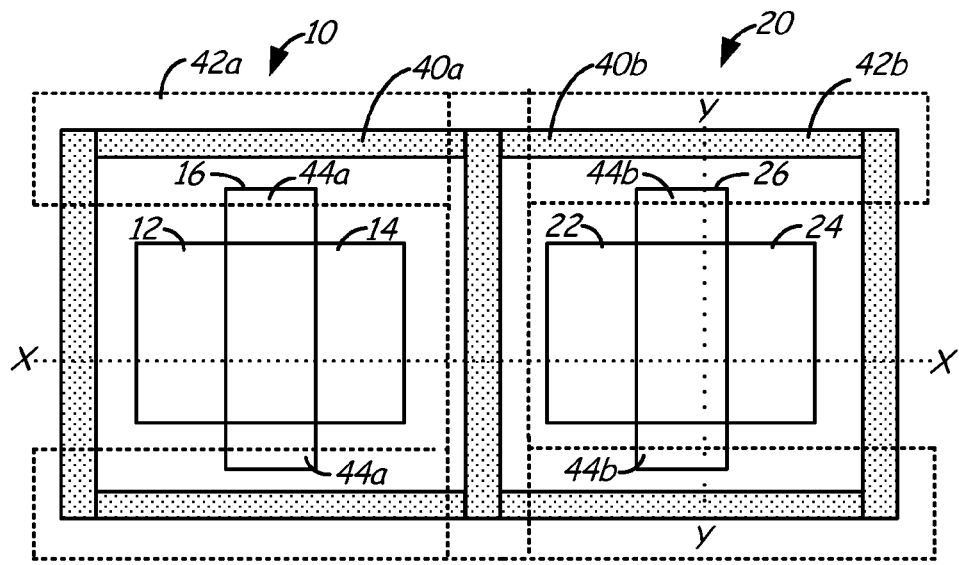
FIG. 3 is a top down view of adjacent semiconductor devices having a channel stop and field plate configuration for preventing inter-device and intra-device leakage according to another embodiment of the present invention.

FIG. 3 is a top down view of adjacent MOS transistors 10 and 20 having a channel stop and field plate configuration for preventing inter-device and intra-device leakage according to another embodiment of the present invention. In the embodiment shown in FIG. 3, diffused channel stops 40a and 40b share a common boundary between MOS transistors 10 and 20, as do field plates 42a and 42b. In other respects, the embodiment shown in FIG. 3 is similar to that shown in FIG. 2.

Figure 4:
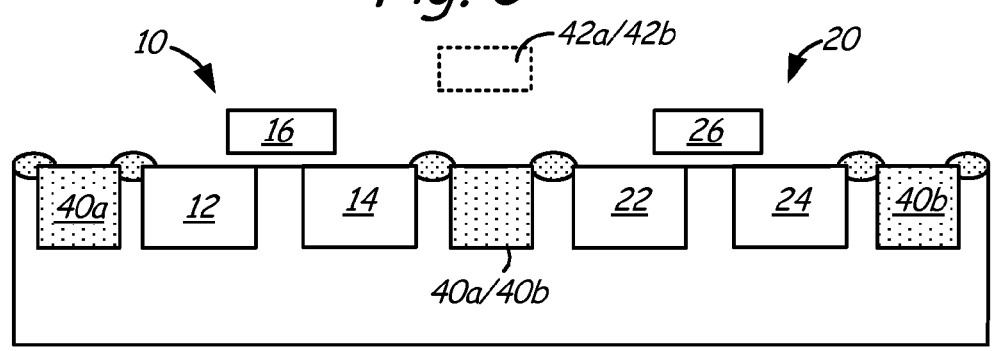
FIG. 4 is a cross sectional view taken at section line X-X in FIG. 3.
Figure 5:
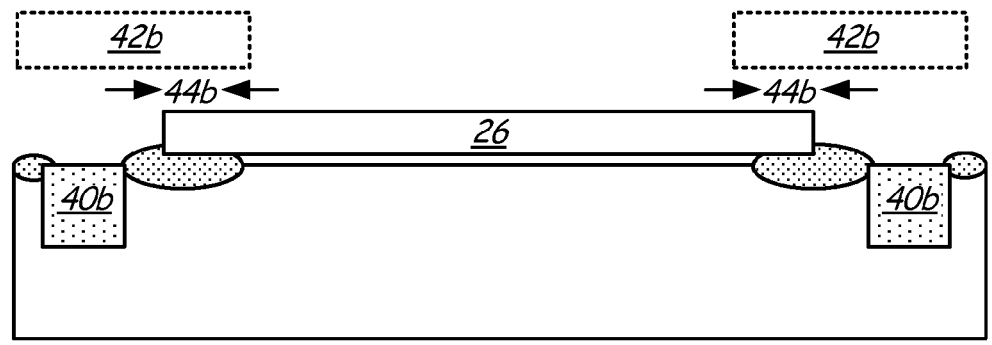
FIG. 5 is a cross sectional view taken at section line Y-Y in FIG. 3.

FIG. 4 is a cross sectional view taken at section line X-X in FIG. 3, and FIG. 5 is a cross sectional view taken at section line Y-Y in FIG. 3. FIG. 4 shows an example of the relative widths of channel stops 40a and 40b and of separation distances between channel stops 40a and 40b and the drain and source regions of MOS transistors 10 and 20. In exemplary embodiments, channel stops 40a and 40b have a width in the range of 0.18 to 0.50 microns, and are separated from the drain and source regions of MOS transistors 10 and 20 by a distance that is determined by the maximum operating voltage of MOS transistors 10 and 20. In exemplary embodiments, channel stops 40a and 40b are created by using the source and drain implant of MOS transistors 10 and 20, although this is not necessary.

FIG. 5 shows the configuration of polysilicon field plate 42b and MOS transistor 20, and the following discussion of these components is also applicable to polysilicon field plate 42a and MOS transistor 10. Polysilicon field plate 42b is made of a second layer of polysilicon that is deposited after polysilicon gate 26 of MOS transistor 20 is deposited and etched. In an exemplary embodiment, the thickness of polysilicon field plate 42b is in the range of 50 nanometers (nm) to 200 nm. Field plate 42b is configured to be electrically isolated from polysilicon gate 26 in region 44b where field plate 42b and polysilicon gate 26 overlap. The amount of overlap in region 44b is determined by the alignment and dimension control in the fabrication process. In an exemplary embodiment, overlap region is about 0.5 microns. The dielectric material between polysilicon gate 26 and field plate 42b is configured to have a sufficient thickness to support the maximum operating voltage of MOS transistor 20. In exemplary embodiments, the thickness of the dielectric material between polysilicon gate 26 and field plate 42b is in the range of 20 nanometers (nm) to 300 nm.

Field plates 42a and 42b have been described with respect to exemplary embodiments as being composed of polysilicon. In other embodiments, field plates 42a and 42b may be composed of any conductive material.

The present invention, as described above with respect to exemplary embodiments, provides a configuration of a channel stop and field plate that collectively prevents inversion that can result in inter-device and intra-device leakage in adjacent devices, such as MOS transistors. Inversion that could result in inter-device leakage is prevented by the diffused channel stop between devices. Inversion that could result in intra-device leakage is prevented by controlling the potential of the silicon substrate in the region between the gate of the device and the channel stop.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An isolation structure for preventing inter-device and intra-device leakage in first and second adjacent semiconductor devices in a substrate, the first and second semiconductor devices each comprising a gate region and at least one active region, the structure comprising:
   a first channel stop region configured to surround the first semiconductor device;
   a second channel stop region configured to surround the second semiconductor device;
   a first field plate located above at least part of the first channel stop region, the first field plate overlapping the gate region of the first semiconductor device in a first overlap region; and
   a second field plate located above at least part of the second channel stop region, the second field plate overlapping the gate region of the second semiconductor device in a second overlap region.

2. The isolation structure of claim 1, wherein the first and second semiconductor devices are MOS transistors each comprising a polysilicon gate region, a source region and a drain region.

3. The isolation structure of claim 1, wherein the first and second field plates and the first and second channel stop regions are held at a common potential.

4. The isolation structure of claim 1, wherein the first and second field plates are composed of polysilicon.

5. The isolation structure of claim 1, wherein a doping concentration of the first and second channel stop regions is greater than $5 \times 10^{18}$ cm$^{-3}$.

6. The isolation structure of claim 1, wherein the first and second channel stop regions have a width in the range of 0.18 to 0.50 microns.

7. The isolation structure of claim 2, wherein the first and second channel stop regions are separate from the source and drain regions of the MOS transistors by a distance that is determined by the maximum operating voltage of the MOS transistors.

8. The isolation structure of claim 2, wherein the first and second channel stop regions are created by using implants for the source and drain regions of the MOS transistors.

9. The isolation structure of claim 1, wherein the first and second overlap regions are about 0.5 microns.

10. The isolation structure of claim 1, wherein a thickness of dielectric material between each gate region of the first and second MOS transistors and a respective one of the first and second field plate is in the range of 20 to 300 nanometers.

11. The isolation structure of claim 1, wherein the first channel stop region and the second channel stop region are separated from one another between the first and second semiconductor devices.

12. The isolation structure of claim 1, wherein the first channel stop region and the second channel stop region share a region between the first and second semiconductor devices.

13. The isolation structure of claim 1, wherein the first field plate and the second field plate are separated from one another between the first and second semiconductor devices.

14. The isolation structure of claim 1, wherein the first field plate and the second field plate share a region between the first and second semiconductor devices.

* * * * *